United States Patent
Heikman et al.

(10) Patent No.: US 10,439,107 B2
(45) Date of Patent: Oct. 8, 2019

(54) CHIP WITH INTEGRATED PHOSPHOR

(71) Applicant: CREE, INC., Durham, NC (US)

(72) Inventors: Sten Heikman, Goleta, CA (US);
James Ibbetson, Santa Barbara, CA (US); Zhimin Jamie Yao, Goleta, CA (US); Fan Zhang, Goleta, CA (US); Matthew Donofrio, Raleigh, NC (US); Christopher P. Hussell, Cary, NC (US); John A. Edmond, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/053,404

(22) Filed: Oct. 14, 2013

(65) Prior Publication Data

US 2014/0217443 A1 Aug. 7, 2014

Related U.S. Application Data

(63) Continuation-in-part of application No. 13/759,229, filed on Feb. 5, 2013, now Pat. No. 9,318,674.

(51) Int. Cl.
*H01L 33/44* (2010.01)
*H01L 33/50* (2010.01)
(Continued)

(52) U.S. Cl.
CPC .......... *H01L 33/50* (2013.01); *H01L 33/0095* (2013.01); *H01L 33/44* (2013.01);
(Continued)

(58) Field of Classification Search
CPC ................. H01L 33/0095; H01L 33/44; H01L 2924/181; H01L 33/52; H01L 2224/96;
(Continued)

(56) References Cited

U.S. PATENT DOCUMENTS

| 7,166,483 B2 | 1/2007 | Liu et al. ................ 438/29 |
| 8,368,100 B2 | 2/2013 | Donofrio et al. |

(Continued)

FOREIGN PATENT DOCUMENTS

| CN | 102593332 | 7/2012 |
| CN | 202332959 | 7/2012 |

(Continued)

OTHER PUBLICATIONS

Mirriam-Webster Online Dictionary definition of "Contact".*

(Continued)

*Primary Examiner* — Eric A. Ward
*Assistant Examiner* — Eric K Ashbahian
(74) *Attorney, Agent, or Firm* — Ferguson Case Orr Paterson, LLP

(57) ABSTRACT

This disclosure relates to light emitting devices and methods of manufacture thereof, including side and/or multi-surface light emitting devices. Embodiments according to the present disclosure include the use of a functional layer, which can comprise a stand-off distance with one or more portions of the light emitter to improve the functional layer's stability during further device processing. The functional layer can further comprise winged portions allowing for the coating of the lower side portions of the light emitter to further interact with emitted light and a reflective layer coating on the functional layer to further improve light extraction and light emission uniformity. Methods of manufacture including methods utilizing virtual wafer structures are also disclosed.

33 Claims, 5 Drawing Sheets

(51) Int. Cl.
*H01L 33/00* (2010.01)
*H01L 33/20* (2010.01)
*H01L 33/48* (2010.01)

(52) U.S. Cl.
CPC ............ *H01L 33/20* (2013.01); *H01L 33/486* (2013.01); *H01L 2924/0002* (2013.01); *H01L 2933/0041* (2013.01)

(58) Field of Classification Search
CPC .............. H01L 24/96; H01L 2933/005; H01L 2933/0091; H01L 33/50–33/60; H01L 33/36–33/387; H01L 33/505; H01L 33/08
USPC ........................................................ 257/98
See application file for complete search history.

(56) References Cited

U.S. PATENT DOCUMENTS

| | | | |
|---|---|---|---|
| 2002/0093023 A1* | 7/2002 | Camras et al. ................ | 257/94 |
| 2002/0187571 A1 | 12/2002 | Collins et al. ................ | 438/29 |
| 2005/0194605 A1 | 9/2005 | Shelton et al. ................ | 257/99 |
| 2008/0128739 A1* | 6/2008 | Sanpei et al. .................. | 257/99 |
| 2008/0315228 A1* | 12/2008 | Krames ................... | H01L 33/46 257/98 |
| 2010/0102204 A1* | 4/2010 | Hoffman ................ | B82Y 20/00 250/208.1 |
| 2010/0164346 A1* | 7/2010 | Li et al. ........................ | 313/46 |
| 2010/0200870 A1 | 8/2010 | Shen | |
| 2010/0207157 A1 | 8/2010 | Schiaffino et al. | |
| 2011/0006668 A1* | 1/2011 | Hussell et al. ................. | 313/499 |
| 2011/0012164 A1 | 1/2011 | Kim ................ | 257/99 |
| 2011/0031516 A1* | 2/2011 | Basin ................... | H01L 33/507 257/98 |
| 2011/0127568 A1 | 6/2011 | Donofrio et al. | |
| 2011/0147779 A1 | 6/2011 | Kang et al. | |
| 2012/0012889 A1 | 1/2012 | Okabe et al. ................ | 257/99 |
| 2012/0034717 A1 | 2/2012 | Colvin et al. ................. | 438/27 |
| 2012/0132949 A1 | 5/2012 | Watari et al. ................ | 257/99 |
| 2012/0193649 A1 | 8/2012 | Donofrio et al. ............. | 257/99 |
| 2012/0193660 A1 | 8/2012 | Donofrio et al. ............. | 257/98 |
| 2012/0193661 A1 | 8/2012 | Emerson | |
| 2012/0205697 A1* | 8/2012 | Kim ..................... | H01L 33/36 257/98 |
| 2012/0267649 A1 | 10/2012 | Shen | |
| 2012/0302124 A1 | 11/2012 | Imazu ............................ | 445/58 |
| 2012/0305939 A1 | 12/2012 | Slater et al. | |
| 2012/0326171 A1 | 12/2012 | Lee et al. ...................... | 257/88 |
| 2013/0033169 A1* | 2/2013 | Ito ........................ | H01L 33/505 313/502 |
| 2013/0037842 A1* | 2/2013 | Yamada .................. | H01L 33/60 257/98 |
| 2013/0200398 A1* | 8/2013 | Wang ..................... | H01L 33/505 257/88 |
| 2013/0200413 A1* | 8/2013 | Kashiwagi et al. ........... | 257/98 |
| 2013/0265769 A1* | 10/2013 | Steedly ................... | F21V 29/00 362/294 |
| 2013/0288409 A1* | 10/2013 | Chen ...................... | H01L 33/44 438/29 |
| 2013/0320370 A1* | 12/2013 | Schubert ............... | H01L 33/405 257/98 |
| 2013/0328073 A1 | 12/2013 | Lowes et al. | |
| 2013/0329425 A1 | 12/2013 | Lowes et al. | |
| 2014/0077235 A1 | 3/2014 | Kwon et al. ................... | 257/88 |
| 2014/0197438 A1* | 7/2014 | Oh et al. ....................... | 257/98 |
| 2015/0207041 A1* | 7/2015 | Butterworth .......... | H01L 33/507 257/98 |

FOREIGN PATENT DOCUMENTS

| | | |
|---|---|---|
| CN | 102754229 | 10/2012 |
| DE | 102008010512 | 8/2009 |
| EP | 2393131 | 7/2011 |
| JP | 2000196197 | 7/2000 |
| WO | WO 200529599 | 3/2005 |
| WO | WO 2005081319 | 9/2005 |

OTHER PUBLICATIONS

Office Action from U.S. Appl. No. 13/759,229, dated Apr. 10, 2014 (Myers).
International Search Report and Written Opinion from Patent Appl. No. PCT/US2014/012707, dated Aug. 11, 2014.
International Search Report and Written Opinion from Appl. No. PCT/US2014/012280, dated Jun. 23, 2014 (from Myers).
Cree, Inc.. "Direct Attach DA3547I LEDs". Data Sheet: CPR3EL Rev. A, 2010. 5 pp.
Cree, Inc., "Direct Attach DA700I LEDs", Data Sheet: CPR3EU Rev.—2011. 5 pp.
Cree, Inc., "Direct Attach DA1000I LEDs", Data Sheet: CPR3ES Rev. A. 210, 5 pp.
U.S. Appl. No. 13/649,052, filed Oct. 10, 2012, Lowes, et al.
U.S. Appl. No. 13/649,067, filed Oct. 10, 2012, Lowes, et al.
Invitation to Pay Additional Fees from PCT appl. No. PCT/US2014/012707, dated May 12, 2014.
Office Action from U.S. Appl. No. 13/759,229, dated Oct. 3, 2014.
Office Action from U.S. Appl. No. 13/759,229, dated Jul. 14, 2015 (Myers).
International Preliminary Report on Patentabiliby from corresponding Appl. No. PCT/US2014/012707, dated Aug. 20, 2015.
The Extended European Search Report for European Patent Appl. No. 14749368.8-1551, dated Jan. 15, 2016.
Notice of Allowance from related U.S. Appl. No. 13/759,229, dated Dec. 1, 2015.
Chinese Office Action for Application No. 2014800199615; dated Jul. 27, 2017.
Third Office Action for Chinese Application no. 2014800199615; dated Mar. 23, 2018.

* cited by examiner

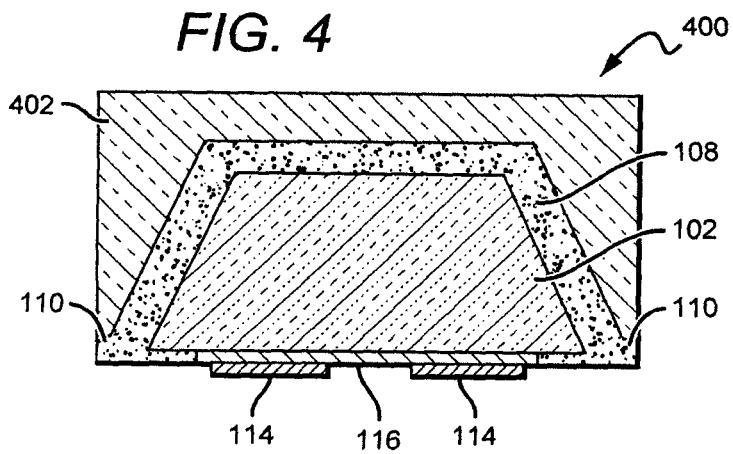
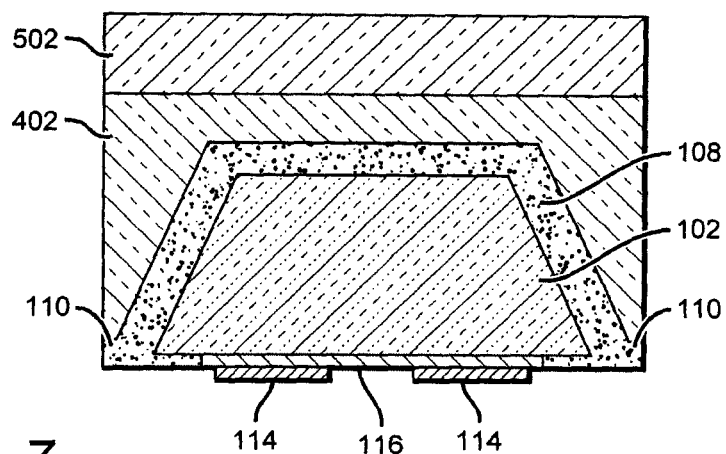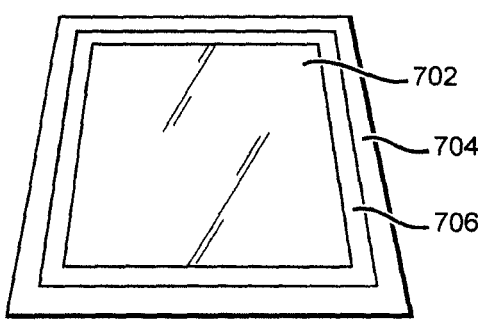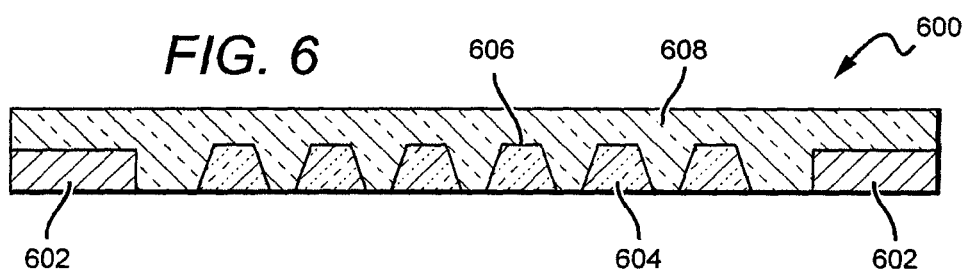

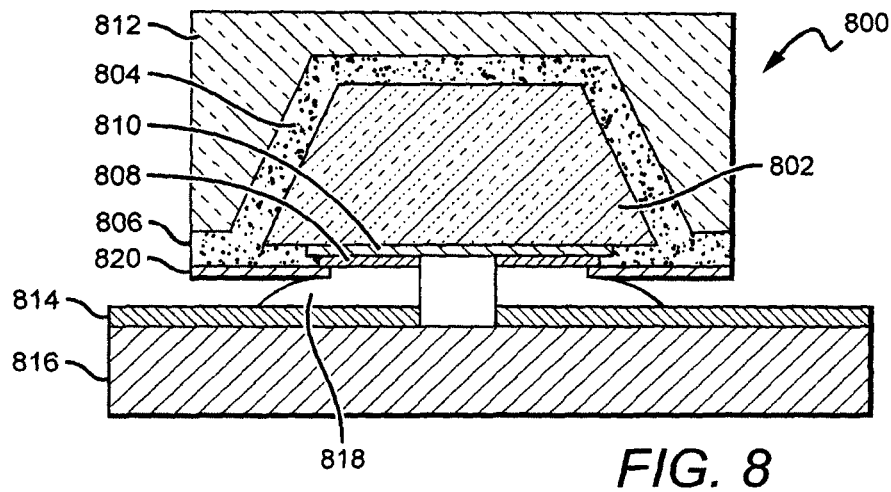
FIG. 8
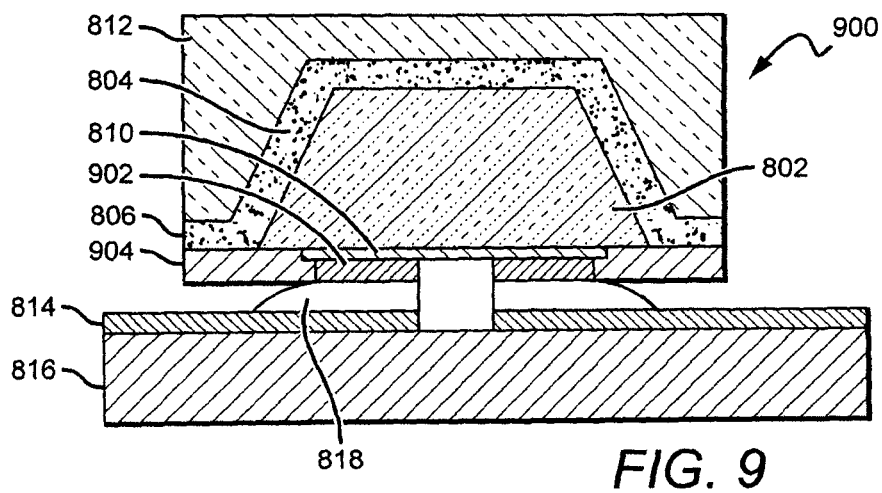
FIG. 9
FIG. 10
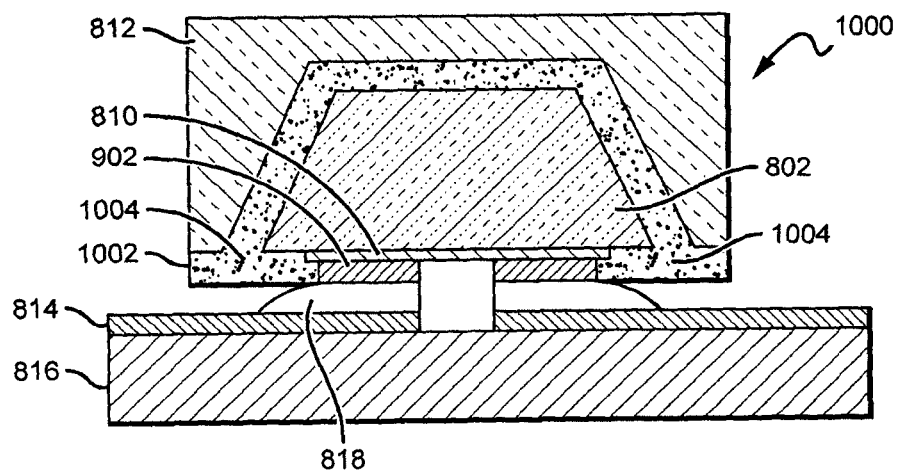

CHIP WITH INTEGRATED PHOSPHOR

CROSS REFERENCE TO RELATED APPLICATIONS

This application is a continuation in part of, and claims the benefit of, U.S. patent application Ser. No. 13/759,229 to Christopher P. Hussell, et al., entitled Submount-Free Light Emitting Diode (LED) Components and Methods of Fabricating Same, filed on Feb. 5, 2013, which is hereby incorporated herein in its entirety by reference, including the drawings, charts, schematics, diagrams and related written description.

BACKGROUND OF THE INVENTION

Field of the Invention

Described herein are devices and methods relating to light emitting devices, such as light emitting diode (LED) chips and components, including LED chips that emit light from multiple and/or side surfaces.

Description of the Related Art

LED-based light emitting devices are increasingly being used in lighting/illumination applications, with one ultimate goal being a replacement for the ubiquitous incandescent light bulb. Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials.

The color or wavelength emitted by an LED is largely dependent on the properties of the material from which it is generated, such as the bandgap of the active region. LEDs have been built to emit light in a range of colors in the visible spectrum including red, yellow, green, and blue. Other LEDs emit in the ultraviolet (UV) range of the electromagnetic spectrum. It is often desirable to incorporate phosphors into a LED to tailor the emission spectrum by converting all or a portion of the light from the LED before it is emitted as it passes through. For example, in some blue LEDs a portion of the blue light is "downconverted" to yellow light. Thus, the LED emits a combination of blue and yellow light to generate a spectrum that appears white to the human eye. This is known as a blue-shifted yellow (BSY) LED device. As used herein, the term "phosphor" is used generically to indicate any photoluminescent material.

Because of the above issues, the application of a conversion layer to an LED chip is typically done at the package level after the LEDs have already been singulated and subsequently bonded to an electronic element such as a PCB. However, applying a conversion material at the package level rather than the wafer level is a less efficient manufacturing process, as it is much easier and cost effective to coat multiple LED chips simultaneously at the wafer level.

One issue that arises when coating an LED chip with a phosphor layer, particularly in the case of LEDs that have multiple emitting surfaces and/or side emitting surfaces, is that there are portions of the LED chip that are not sufficiently coated, such that some unconverted light escapes from the LED chip without being converted by the phosphor layer. For example, when LED chips are fabricated in a plurality on a wafer, individual LED chips are typically fabricated closely adjacent to one another, sometimes with no space between. If these LED chips are then coated with a phosphor layer prior to the singulation of the wafer into individual LED chips, the chips after singulation may have no or inconsistent phosphor layer thickness on certain areas of the LED chip than on the rest of the LED chip, for example, a thinner coating near the bottom sides of the singulated LED chip. In cases of BSY LED devices discussed above, this results in light appearing blue from certain angles, resulting in decreased LED device color uniformity.

SUMMARY OF THE INVENTION

Embodiments incorporating features of the present invention include devices and methods related to light emitting devices comprising features allowing for increased light emission uniformity including particular functional layer arrangements. These devices are coated with a functional layer material, which can be arranged such that emitted light appears uniform over a wide range of viewing angles, for example, by arranging the functional layer such that light emitted from the emitting surfaces of the light emitter passes through a substantially similar functional layer thickness. The coating can be applied at a "virtual wafer" level step of device fabrication and can be arranged to have a stand-off distance from portions of the light emitter, such as a portion of the light emitter's contacts, to further ensure device stability during attachment at the package level as is set forth in more detail below.

The functional layer can include any layer that can interact with emitted light to affect one or more properties of the emitted light, for example, wavelength, intensity and/or direction. The functional layer can comprise many different types of layers including conversion layers (e.g. phosphor layers), filter layers, antireflective layers, single crystalline converter layers, and light scattering layers.

The above mentioned uniform light emission throughout a wide range of viewing angles can be achieved in many ways that are further outlined below, for example, through the application of a uniform coating to the LEDs at a "virtual wafer" level accounting for the effects of singulation methods on the functional layer's dimensions and/or by the formation of functional layer "winged" portions.

In some embodiments according to the present invention, the functional layer further comprises an expanded lateral portion forming "winged structures." These functional layer "wings" increase the surface area of the functional layer in certain areas needing improved functional layer interaction, for example allowing light emitted from the lower side portions of an LED-based light emitter to efficiently interact with the functional layer.

One embodiment incorporating features of the present invention includes a light emitting device, which comprises a light emitter comprising a top emitting surface and at least one side emitting surface, one or more contacts on a surface of the light emitter and a functional layer on the light emitter, wherein the functional layer is arranged such that light emitted from the top emitting surface and the at least one side emitting surface passes through a substantially similar functional layer thickness and wherein the functional layer and the one or more contacts are separated by a stand-off distance.

Another embodiment incorporating features of the present invention includes a light emitting device, which comprises a light emitter, one or more contacts on a surface of the light emitter and a functional layer on the light emitter, wherein the functional layer comprises an extended lateral portion extending beyond the footprint of the light emitter, wherein the extended lateral portion is coated with a reflective material.

Yet another embodiment incorporating features of the present invention includes a light emitting device, which comprises a light emitter comprising a top emitting surface and at least one side emitting surface, one or more contacts on a surface of the light emitter, a functional layer on the light emitter, wherein the functional layer is arranged such that light emitted from the top emitting surface and the at least one side emitting surface passes through a substantially similar functional layer thickness, a first utility layer on the functional layer and a second utility layer on the first utility layer.

Still another embodiment incorporating features of the present invention includes a method of manufacturing a light emitting device, wherein the method comprises the steps of providing an adhesive layer, pressing a light emitter into the adhesive layer to create a functional layer stand-off distance, coating the light emitter with a functional layer material and releasing the light emitter from the adhesive layer.

These and other further features and advantages of the invention would be apparent to those skilled in the art from the following detailed description, taken together with the accompanying drawings, wherein like numerals designate corresponding parts in the figures, in which:

BRIEF DESCRIPTION OF THE DRAWINGS

FIG. 4 is front sectional view of a light emitting device incorporating features of the present invention;

FIG. 5 is front sectional view of a light emitting device incorporating features of the present invention;

FIG. 6 is a sectional view of a light emitting device incorporating features of the present invention;

FIG. 7 is a top perspective view a light emitting device incorporating features of the present invention;

FIG. 8 is front sectional view of a light emitting device incorporating features of the present invention;

FIG. 9 is front sectional view of a light emitting device incorporating features of the present invention;

FIG. 10 is front sectional view of a light emitting device incorporating features of the present invention;

DETAILED DESCRIPTION OF THE INVENTION

Figure 1:
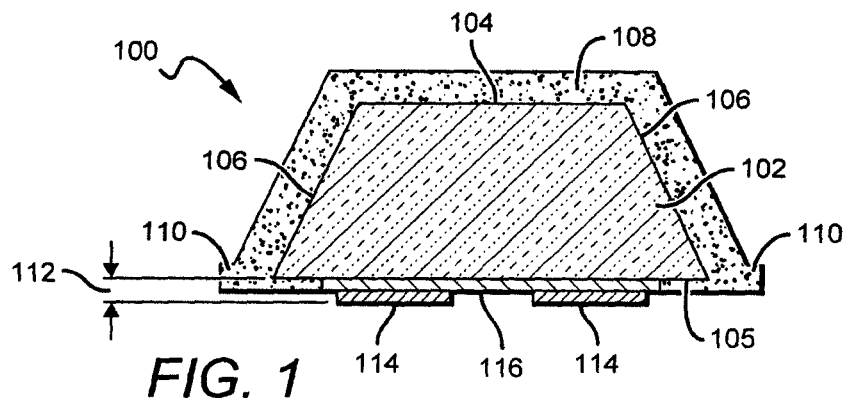
FIG. 1 is front sectional view of a light emitting device incorporating features of the present invention.

The present disclosure will now set forth detailed descriptions of various embodiments. These embodiments provide methods and devices pertaining to light emitting devices, such as various light emitters, LED chips, LED wafers, LED components, and methods of manufacture thereof. Embodiments incorporating features of the present invention allow for the efficient coating of LED chips to improve color uniformity.

In some embodiments incorporating features of the present invention, light emitters, such as LED chips, are provided with a functional layer coating arranged such that the color and the intensity of light emitted from the light emitters is substantially uniform throughout a wide range of viewing angles, for example, by arranging the functional layer such that light emitted from the emitting surfaces of the light emitter passes through a substantially similar functional layer thickness. In some embodiments according to the present invention, the functional layer comprises an expanded lateral portion forming functional layer "wings" which allow light emitted from certain portions of the light emitter, for example, the lower side portions of the light emitter, to more efficiently interact with the functional layer. For example, in a white-emitting LED chip that operates utilizing a BSY arrangement as described above, more emitted blue light can interact with a phosphor conversion layer and blue light "leakage" will not occur at the bottom side regions of the LED chip.

Embodiments according to the present disclosure can allow for side and/or multi-surface-emitting light emitters, to be efficiently coated at a "virtual wafer" or array level. Typically, side-emitting LED chips are coated at the package level as discussed above. By providing a functional layer and utilizing sufficient light emitter spacing as discussed below, individual light emitters can be efficiently singulated such that a portion of the functional layer remains, allowing for individual light emitters to comprise a lower side emission surface sufficiently coated with a functional layer. The functional layer can comprise a stand-off distance, such as a vertical stand-off distance, between the functional layer and the bottom of the light emitters contacts. This stand-off distance helps ensure a robust chip attach, by preventing the functional layer from interacting with the package substrate through thermal expansion during the attach process.

Embodiments incorporating features of the present invention can also include various structures to improve stability of a light emitter array, such as an LED chip array, during the manufacturing process, such as additional adhesive and/or virtual wafers comprising a silicone support, a glass support and/or a frame structure.

Some embodiments of light emitter components according to the present disclosure utilize a reflective material, such as a white diffusive paint or coating, along with conversion material wings to further improve light extraction and emission uniformity.

In the description that follows, numerous details are set forth in order to provide a thorough understanding of the invention. It will be appreciated by those skilled in the art that variations of these specific details are possible while still achieving the results of the invention. Well-known elements and processing steps are generally not described in detail in order to avoid unnecessarily obscuring the description of the invention.

Embodiments of the invention are described herein with reference to illustrations that are schematic illustrations of embodiments of the invention. As such, the actual size, components and features can be different, and variations from the shapes of the illustrations as a result, for example, of technological capabilities, manufacturing techniques and/or tolerances are expected. Embodiments of the invention should not be construed as limited to the particular shapes or components of the regions illustrated herein but are to include deviations in shapes/components that result, for example, from manufacturing or technological availability. The regions illustrated in the figures are schematic in nature and their shapes are not intended to illustrate the precise shape or functionality of a feature of a device and are not intended to limit the scope of the invention. In addition, components may be shown as one unit but may instead be a collection of components or units, or a collection of components or units may exist as one unit.

Throughout this description, the preferred embodiment and examples illustrated should be considered as exemplars, rather than as limitations on the present invention. As used herein, the term "invention," "device," "method," "present invention," "present device" or "present method" refers to any one of the embodiments of the invention described herein, and any equivalents. Furthermore, reference to various feature(s) of the "invention," "device," "method," "present invention," "present device" or "present method" throughout this document does not mean that all claimed embodiments or methods must include the referenced feature(s).

It is also understood that when an element or feature is referred to as being "on" or "adjacent" to another element or feature, it can be directly on or adjacent the other element or feature or intervening elements or features may also be present. It is also understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "outer", "above", "lower", "below", "horizontal," "vertical" and similar terms, may be used herein to describe a relationship of one feature to another. It is understood that these terms are intended to encompass different orientations in addition to the orientation depicted in the figures.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present invention. As used herein, the term "and/or" includes any and all combinations of one or more of the associated list items.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," when used herein, specify the presence of stated features, integers, steps, operations, elements, and/or components, but do not preclude the presence or addition of one or more other features, integers, steps, operations, elements, components, and/or groups thereof.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Light emitters according to the present disclosure can include various light emitting devices, for example, solid state light emitters such as LEDs, although it is understood that other light emitting devices can utilize features of the present disclosure. FIG. 1 illustrates a light emitting device 100 comprising a light emitter 102 that can emit from its top 104, bottom 105 and side surfaces 106. Side-surfaces 106 can include sloped or angled sidewall portions of the light emitter. Many types of light emitters can be utilized with embodiments incorporating features of the present disclosure, including any side and/or multiple-surface emitting LED chips. Examples of such LED chips are set forth in U.S. Pat. No. 8,368,100 to Donofrio, et al., and assigned to Cree, Inc., which is hereby incorporated in its entirety by reference.

The light emitter 102 can be coated with one or more functional layers 108. The functional layer 108 can be arranged to cover various portions of the light emitter 102. In some embodiments all surfaces of the light emitter 102 are covered. In other embodiments, all surfaces of the light emitter 102 except for the bottom are covered. As mentioned above, the functional layer 108 can interact with light emitted from the light emitter 102 to affect the properties of the emitted light, for example, color, intensity and/or direction. As mentioned above, the functional layer 108 can comprise many different types of layers including conversion layers, filter layers, antireflective layers, single crystalline converter layers, and light scattering layers.

In some embodiments of the light emitting device 100, the functional layer 108 comprises a wavelength conversion layer comprising a binder material, such as epoxy, silicone or a silicone-based material, which contains phosphor particles. Such a wavelength conversion layer converts a portion of the light emitted from the light emitter 102 to a different wavelength, a process that is known in the art. One example of this process, is converting a portion of blue-emitted light from light emitter, such as an LED chip, to yellow light. Yttrium aluminum garnet (YAG) is an example of a common phosphor that may be used.

In some embodiments, the phosphor particles comprise many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and re-emits yellow, the single crystalline phosphor can comprise YAG:Ce. This embodiment is particularly applicable to light emitters that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}RE_xO_{12}$:Ce (TAG);
RE=Y, Gd, La, Lu; and/or
$Sr_{2-x-y}Ba_xCa_ySiO_4$:Eu.

In other embodiments, other compounds can be used with a YAG host for absorption and re-emission of different wavelengths of light. For example, a YAG:Nb single crystal phosphor can be provided to absorb blue light and re-emit red light. First and second phosphors can also be combined for higher CRI white (i.e., warm white) with the yellow phosphors above combined with red phosphors. Various red phosphors can be used including:

$Sr_xCa_{1-x}S:Eu,Y$; Y=halide;
$CaSiAlN_3:Eu$; or
$Sr_{2-y}Ca_ySiO_4:Eu$.

Other phosphors can be used to create saturated color emission by converting substantially all light to a particular color. For example, the following phosphors can be used to generate green saturated light:

$SrGa_2S_4:Eu$;
$Sr_{2-y}Ba_ySiO_4:Eu$; or
$SrSi_2O_2N_2:Eu$.

The following lists some additional suitable phosphors that can be used as conversion particles, although others can be used. Each exhibits excitation in the blue and/or UV emission spectrum, provides a desirable peak emission, has efficient light conversion:

Yellow/Green
$(Sr,Ca,Ba)(Al,Ga)_2S_4:Eu^{2+}$
$Ba_2(Mg,Zn)Si_2O_7Eu^{2+}$
$Gd_{0.46}Sr_{0.31}Al_{1.23}O_xF_{1.38}:Eu^{2+}{}_{0.06}$
$(Ba_{1-x-y}Sr_xCa_y)SiO_4:Eu$
$Ba_2SiO_4=Eu^{2+}$ Red
$Lu_2O_3=Eu^{3+}$
$(Sr_{2-x}La_x)(Cei_{-x}Eu_x)O_4$
$Sr_2C_{1-x}Eu_xO_4$
$SrTiO_3:Pr^{3+},Ga^{3+}$
$CaAlSiN_3IEu^{2+}$
$Sr_2Si_5N_8=Eu^{2+}$ In some embodiments, the functional layer 108 comprises a light scattering layer, which comprises a binder material as discussed above and light scatting particles, for example titanium oxide particles. In some embodiments, the functional layer 108 comprises materials to alter the refractive index of the functional layer 108. In some embodiments, the functional layer comprises a combination of one or more of the types of functional layers described herein (e.g. a wavelength conversion layer and a scattering or refractive index altering layer).

In some embodiments, the functional layer 108 interacts with the light emitter 102 such that the light emitter 102 emits white light. Embodiments incorporating features of the present invention include methods wherein phosphor coating and color binning is done at a virtual wafer level, prior to packaging, for example, prior to bonding an LED chip to additional electronic elements, such as a printed circuit board (PCB). When designing a light emitter that is a white emitting LED chip, it is useful for color uniformity purposes that all emitting sides of the LED chip are coated with a conversion layer.

Referring again to FIG. 1, to achieve the above uniformity, embodiments according to the present disclosure comprise a functional layer that can coat all exposed (i.e. not covered by a reflector or other feature) light emitting sides of the light emitter 102. The functional layer 108 can coat the light emitter 102 such that the color and the intensity of light emitted from the light emitting device 100 is uniform throughout a wide range of viewing angles, for example, by arranging the functional layer such that light emitted from the light emitting surfaces passes through a substantially similar functional layer thickness. Methods of providing this functional layer coating are discussed further below.

Some embodiments further comprise functional layer "wings" 110 that extend laterally beyond the footprint of the light emitter 102, thus resulting in functional layer 108 forming an extended lateral portion in relation to light emitter 102. These functional layer wings 110 can be provided at one or more areas of the functional layer to provide additional surface area for emitted light to pass through, for example, near one or more of the lower sides of the light emitter 102.

In designing the functional layer 108, it is beneficial to have a well-controlled stand-off distance 112 between the functional layer 108 (or a specific portion of the functional layer, such as wings 110 in embodiments comprising wings) and another portion of the light emitting device, for example, the bottom of the contacts 114. This stand-off distance can comprise a space in between the functional layer 108 and another layer or structure, with the space being free of an intervening layer or other device elements. During attachment of the light emitter 102 to a package substrate or electronic element (such as a PCB), the functional layer 108 expands thermally and can bend down slightly. If the stand-off distance 112 is too small, the thermal deformation of the functional layer 108 can lift the light emitter 102 off a substrate or electronic element, preventing the contacts 114 from forming a sufficient bond to the substrate or electronic element. In some cases the space between the functional layer 108 and the package substrate or electronic element (such as a PCB) is large due to a thick bond line formed by solder or conducting epoxy. In these cases it is not necessary to have a stand-off, and the stand-off distance 112 can be zero or even negative.

If the above-described stand-off distance 112 is too large, however, then light emitted from the light emitter 102 can escape at the bottom surface of the light emitter 102 and will not sufficiently interact with the functional layer 108. In embodiments wherein light emitted from the light emitter 102 is converted by functional layer 108, this can cause gross non-uniformity of the color emitted from the light emitting device 100. In some embodiments, the stand-off distance 112 is between 5 and 20 um. In other embodiments, the stand-off distance 112 is between 10 and 30 um. It is understood that while a "vertical" stand-off distance between the functional layer 108 and the bottom of contacts 114 is described herein, methods and devices according to the present disclosure can utilize the creation of other stand-off distances as needed for device design and operation, for example, a stand-off between the functional layer 108 or the functional layer wings 110 and a top portion of the contacts 114 or a portion of the light emitter 102.

The light emitting device 100 can also comprise a reflector 116. Many different reflectors can be used including a mirror layer comprising silver, diffuse reflectors, such as materials comprising a reflective white color, and thin film reflectors, such as metal or dielectric layers. In some embodiments, the reflector 116 is provided on a portion of the light emitter 102 that is not covered by functional layer 108.

Figure 2:
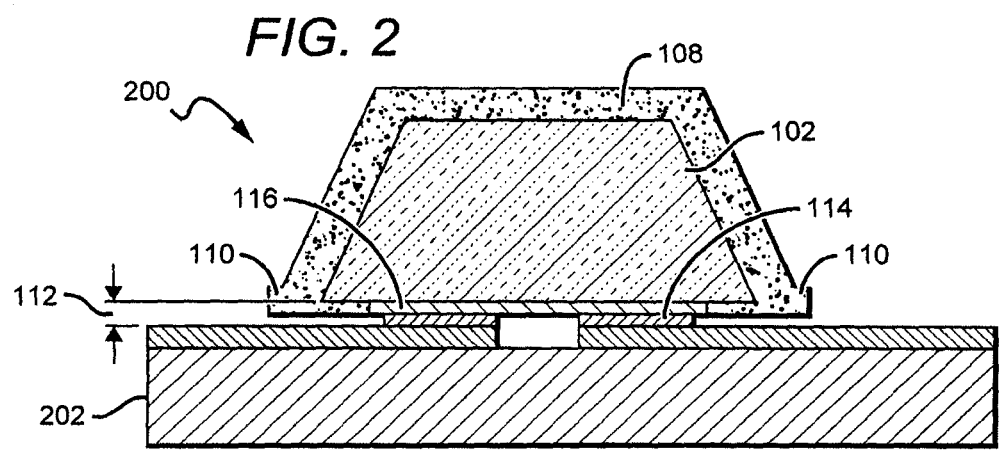
FIG. 2 is front sectional view of a light emitting device incorporating features of the present invention.

Light emitting devices incorporating features of the present invention can also be manufactured as components integrated into other electronic devices. FIG. 2 shows a light emitting device 200, similar to the light emitting device 100 in FIG. 1 above, wherein like reference numbers are used to denote like features. The light emitting device 200 comprises a light emitter 102, a functional layer 108, which in turn can comprise functional layer wings 110, contacts 114 and a reflector 116. The light emitting device 200 is connected to a package substrate 202, which can comprise an electronic element, for example a PCB. As can be seen in FIG. 2, the stand-off distance 112 between the functional layer wings 110 and contacts 114 allows for some deformation of functional layer 108 to occur without damaging the connection between the light emitting device 200 and the package substrate 202.

Figure 3A:
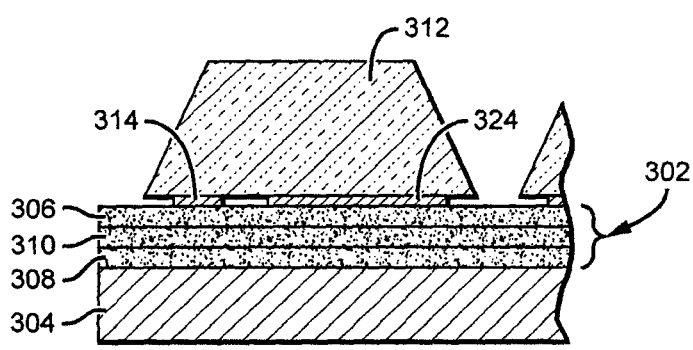
FIG. 3A-3F shows a method of manufacture of a light emitting device incorporating features to the present invention.

Methods of manufacturing light emitting devices as discussed above will now be described. FIGS. 3A-3F depict the steps of a method of coating light emitters with a functional layer according to the present disclosure. In FIG. 3A, an adhesive 302, such as a tape based adhesive, is deposited and/or laminated on a carrier wafer 304, for example, a substrate commonly used in the art for mounting LED chips, such as a sapphire or silicon carbide substrate. This allows for the formation of a "virtual wafer" in which an array of LED dies can be deposited thereon. It is understood that the use of a carrier wafer is optional and provides the advantage of improving the structural integrity for the array. It is possible to utilize the method set forth in FIGS. 3A-3F utilizing a robust and structurally sound adhesive configuration alone. Other further embodiments which utilize other types of "virtual wafers" are outlined below.

In some embodiments, the adhesive layer 302 can comprise multiple adhesive layers or other configurations to facilitate the adhesive and releasing properties of the adhesive layer 302. In some embodiments, the adhesive layer 302 can comprise an ultraviolet (UV) adhesive 306 facing up and a thermal release adhesive 308 at the bottom or internal to the adhesive layer 302. In some embodiments, the UV adhesive 306 is connected to the thermal adhesive 308 by one or more tape based film layers 310. The adhesive layer 302 can be a single tape or a stack of tapes laminated on top of each other. A UV adhesive is any adhesive that changes its adhesive properties when exposed to light radiating from the UV spectrum, for example an adhesive that will release when exposed to UV light. A thermal adhesive is any adhesive that changes its adhesive properties when exposed to changes in temperature, for example a heat-release adhesive.

One example adhesive layer 302 configuration that can be used with methods according to the present disclosure is utilizing Denka UDT-1010W® UV tape on top of Nitto Denko 31950E® thermal release tape. In lieu of a UV adhesive 306, any temperature-resistant adhesive that is or can be made easily removable can be utilized in conjunction with the thermal adhesive 308 to provide a similar adhesive layer 302 configuration.

Figure 3B:
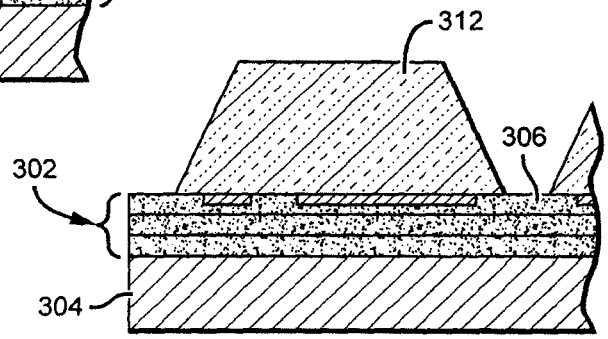

After the adhesive layer 302 is deposited on the carrier substrate 304, one or more light emitters 312 (an array of light emitters shown) comprising contacts 314 are placed on the adhesive layer 302. FIG. 3B illustrates light emitters 312 being pressed into the adhesive layer 302 by applying a uniform pressure to the top of the light emitters 312 and/or by heating the light emitters 312 and/or the carrier wafer 304. This step of pressing the light emitters 312 into the adhesive layer 302 creates the stand-off distance between the functional layer and the bottom of the contacts formed later in the process. In some embodiments, the light emitters 312 can be pressed into the adhesive layer 302 by about 5-20 um to create a corresponding functional layer wing stand-off. In other embodiments the light emitters 312 can be pressed into the adhesive layer 302 by about 1-5 um, enough to ensure contacts 314 stay clean throughout the process and do not get coated by the functional layer. One example of press conditions is to perform the press in a wafer bond tool at 120° C., and utilize a force of 30 pounds over a 4-inch diameter wafer. After the press is completed, the adhesive layer 302 can be cured, for example, by exposing the UV adhesive 306 to UV light. This can prevent degradation of the UV adhesive during subsequent high temperature processes.

The individual light emitters 312 in the array should be adequately spaced apart such that during singulation, the light emitters 312 can retain a significant portion of their side coating functional layer, for example, to create functional layer wings. In some embodiments, this desired spacing is equal to two times the desired wing dimensions. In some embodiments, the spacing between light emitters 312 is calculated such that the individual LED die are separated by enough conversion material that part of the functional layer is "sacrificial" and is removed during singulation such that each LED die still has a sufficient side functional layer portion even after removal of the sacrificial lateral portion of the functional layer.

Figure 3C:
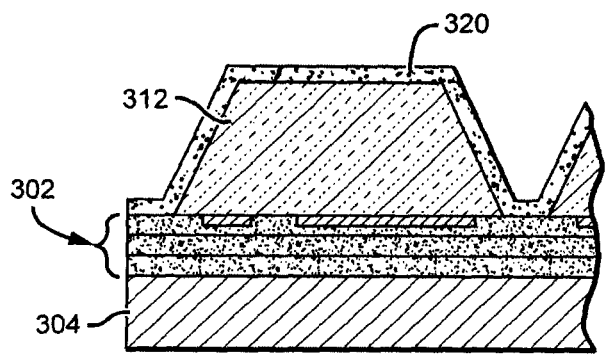

As shown in FIG. 3C, the light emitter array 312 on adhesive layer 302 is then coated with a functional layer 320. The light emitter array 312 can be coated utilizing any functional layer coating methods that are known in the art, for example, electrophoretic deposition, stencil printing, spin or spray coating, etc. The functional layer 320 can be a conformal coating as pictured in FIG. 3C, in which case coating application via spraying can be utilized. In spraying, a solvent is typically added to the functional layer material to adjust the mixture viscosity. In some embodiments, the functional layer material is coated over the light emitters 312 such that a functional layer having approximately an equivalent thickness on all coated sides is formed. The light emitters 312 and other surfaces can be heated to remove the solvent from the functional layer material mixture as it is deposited. Heating also has the benefit of "snap-curing" the functional layer material, preventing it from flowing down the sides of the light emitters 312, thus enabling a uniform coating thickness to be maintained.

The carrier wafer 304 can be placed on a heated stage during the spray operation, and the stage temperature can be kept at a desired temperature. In some embodiments, this desired temperature is in the range 100-170° C. The functional layer 320 can also be non-conforming, for example, a layer with a more or less flat top, with thicker coating between the dies than on top of the light emitters. In this case, the conversion material can be dispensed over the array, and substrate heating is not necessary.

Figure 3D:
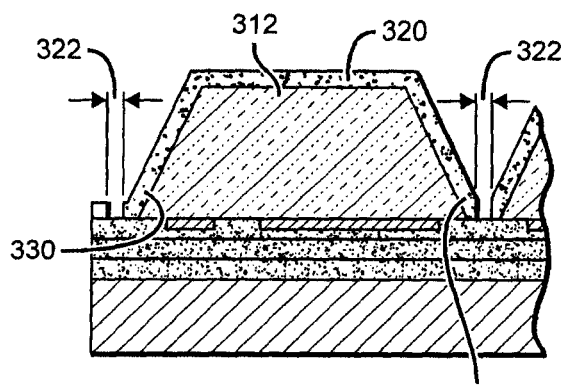

After deposition of the functional layer 320, the light emitter 312 array can then be singulated, as is shown in FIG. 3D. In some embodiments, the light emitter 312 array is singulated via mechanical means such as a dicing saw. A mechanical dicing saw has an advantage over a laser dicing since laser dicing may char a silicone binder and cause absorption losses. Other singulation methods that are known in the art are also acceptable. In some embodiments, water jet dicing is utilized as another possible singulation method. As is shown in FIG. 3D, the lateral sacrificial distance portion 322 of functional layer 320 is removed and a functional layer wing 330 can be formed. As also depicted in FIG. 3D the functional layer wing 330 differs in proportions to another functional layer wing 332. In some embodiments the proportions between the functional layer wings are identical or nearly identical.

Figure 3E:
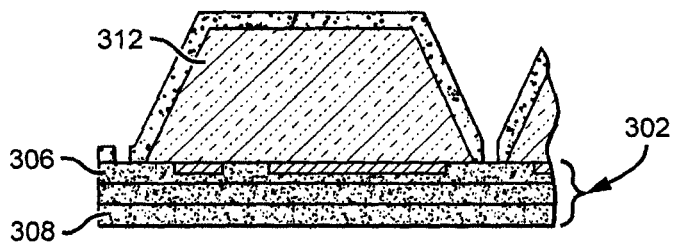

As is shown in FIG. 3E, the light emitter 312 array and adhesive layer 302 are released from the carrier wafer. In embodiments utilizing a UV adhesive 306 and a thermal release adhesive 308, the release of the light emitter can be performed by heating up the carrier wafer to activate the thermal release feature of the thermal release adhesive 308. The thermal release adhesive 308 can be selected from a material such that the release temperature is greater than any temperature utilized in the previous steps, including the process of pressing the light emitters 312 into the UV adhesive 306 shown in FIG. 3B and the converter coating process shown in FIG. 3C. The thermal release temperature can also be chosen to be lower, to prevent the UV adhesive 306 from degrading to the point of leaving unwanted residues on the light emitter 312. In some embodiments, the release temperature is in the range 170-230° C.

Figure 3F:
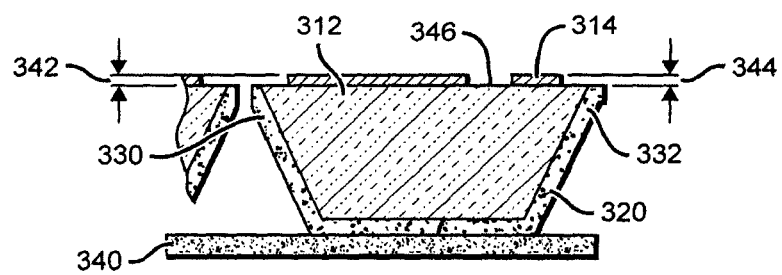

The singulated light emitters 312 can then optionally be subjected to testing for functionality and operability factors such as color point. FIG. 3F shows the light emitter 312 array being transferred to a new adhesive support layer 340 such that the contacts 314 are exposed and the light emitters 312 can be probed electrically, and light emission data can be collected from the bottom of the light emitter. As is also shown clearly in FIG. 3F, the stand-off distance 342 344, between the respective functional layer wings 330, 332 that was created by the process can be configured such that a surface (in this case the bottom surface 346) of the light emitter 312 is left uncovered by the functional layer 320. In some embodiments, the functional layer 320 coats bottom surface 346.

The methods described above allow for the efficient coating of light emitters with a functional layer at the wafer or chip level, in addition to the package level as functional layer coating is typically carried out in the prior art. One advantage of such coating methods is that individual light emitters can be produced and coated prior to attachment to electronic elements, such as PCBs, and thus be sold as pre-coated parts for use in such devices. Additionally, a large array of light emitters can be simultaneously coated, increasing manufacturing efficiency and saving on time and cost.

The adhesive layer can also be provided with additional layers providing various benefits including but not limited to providing structural support, providing improvements to light uniformity and light extraction and providing lens-like qualities that can affect the properties and direction of emitted light. FIG. 4 shows a light emitting device 400, similar to the light emitting device 100 in FIG. 1 above, wherein like reference numbers are used to denote like features. The light emitting device 400 comprises a light emitter 102, a functional layer 108, which in turn can comprise functional layer wings 110, contacts 114 and a reflector 116. FIG. 4 also shows a first utility layer 402 added on top of the functional layer 108. Like the carrier substrate and/or adhesive strip embodiments discussed above, the first utility layer 402 can add mechanical stability to the light emitter 102 array during the manufacturing process before it is singulated, providing a "virtual wafer." The first utility layer can comprise various materials such as epoxy, resins, silicone and silicone-based materials. First utility layer can also be configured to have a variety of other useful purposes, for example, first utility layer 402 can have features that improve light extraction or environmental protection.

The first utility layer 402 allows for an alternative process flow, after the step depicted in FIG. 3C above, wherein the functional layer is applied to the light emitter array, the first utility layer is then added on the functional layer, further coating the light emitter array and connecting one or more of the light emitters together. The light emitter array is then removed from the carrier and the adhesive layer is removed from the backside. This creates a "virtual wafer" of light emitters held together by converter material and the first utility layer. The virtual wafer can be probed like a normal wafer on a wafer prober, and if the prober collects light from the opposite side of the light emitters then the collected light intensity and color point can be used to organize and evaluate the singulated light emitters. In some embodiments the first utility layer 402 can be clear, transparent or translucent, this allows for the first utility layer 402 to remain on the light emitter 102 after the singulation step depicted in FIG. 3D above, as light can pass through the first utility layer 402 with minimal interference. In some embodiments the first utility layer can be clear silicone.

In embodiments utilizing a first utility layer 402 made of silicone, sometimes the silicone sidewalls 404 of the light emitting device 400 have certain roughness after singulation due to the dicing process utilized. The sidewall roughness can potentially have negative performance effects, such as inconsistent color point, larger color spread, asymmetric far-field emission patterns, etc. One method for reducing the sidewall roughness is to use a post-singulation chemical etching process, for example exposing the parts to a diluted silicone stripper (such as polygone 505° available from RPM Technology LLC) for 5~30 seconds. Another method for reducing the sidewall roughness is to re-coat a thin layer of silicone on the surface. This can be achieved by exposing the light emitting device 400 to thinned silicone (silicone mixed with o-Xylene, for example) followed by removing excess un-cured silicone by directing a high velocity flow of compressed dry air at the light emitting device 400. A final oven bake can be further utilized to cure the thin silicone coating.

The virtual wafer may be subject to some mechanical distortion due to shrinking of the first utility layer material during cool down after high temperature curing. If this distortion causes problems during probing and/or singulation then the embodiment depicted in FIG. 5 can be implemented. FIG. 5 shows a light emitting device 500, similar to the light emitting device 400 in FIG. 4 above, wherein like reference numbers are used to denote like features. The light emitting device 500 comprises a light emitter 102, a functional layer 108, which in turn can comprise functional layer wings 110, contacts 114, a reflector 116 and a first utility layer 402 added on top of the functional layer 108.

Light emitting device 500 also further comprises a second utility layer 502, which can be added on the first utility layer, for example, during the alternative process steps discussed above. Various materials can be utilized for the second utility layer 502, including any at least partially clear material, at least partially optically transparent material and/or at least partially optically translucent material. Some example materials include materials as discussed above in reference to the first utility layer, with those materials typically being more rigid than those selected for the first utility layer 402. In some embodiments, second utility layer 502 comprises a glass layer, for example, a glass virtual wafer. In some embodiments, second utility layer 502 comprises glass while the first utility layer 402 comprises silicon. In other embodiments, second utility layer 502 comprises plastic or silicone. The second utility layer 502 adds to the mechanical stability of the virtual wafer, and it prevents shrinkage and distortion.

The refractive index of the first utility layer 402 and the second utility layer 502 can be the same, or it can be different. In embodiments wherein the refractive index between the first utility layer 402 and the second utility layer 502 are different, either of the layer can comprise light extraction enhancing elements, for example, roughened surfaces, to assist with the transition of rays of emitted light through the layers.

Both the first utility layer 402 and the second utility layer 502 can also be shaped or otherwise altered for various advantageous purposes, for example, to function as various lenses which can be utilized to improve light extraction and to shape and control the properties and direction of rays of emitted light. The second utility layer 502 can be shaped prior to, during or after the singulation step during device manufacture. In some embodiments, the first utility layer 402 and/or the second utility layer 502 can be a preformed structure already comprising a desired shape and can comprise features that can align with the LED array and/or can comprise features that contribute to the shape and stability of the virtual wafer. The first utility layer 402 and the second utility layer 502 can also be shaped simultaneously by applying a mold as the layers are formed.

Various processes can be utilized to shape the first and second utility layers 402, 502, for example, the utility layers 402, 502 can be etched during singulation via a mechanical process, for example, a pointed saw blade and/or via a molding process and/or a chemical, laser or water-jet etch as discussed above. The second utility layer 502 can be also shaped in a wide variety of ways to produce various desired emission patterns without substantially affecting the underlying first utility layer 402.

Some example shapes that the first and second utility layers 402, 502 can comprise include but are not limited to: cubed shapes, spherical or hemispherical shapes, regular polygonal shapes, curved shapes and bullet shapes. In some embodiments, angled side surfaces are formed in second utility layer 502. In some embodiments, one or more roughed surfaces are formed in second utility layer 502. Additional examples of various shapes and advantages of such shapes are set forth in detail in U.S. patent application Ser. Nos. 13/649,052 and 13/649,067, both also assigned to Cree, Inc., which are hereby incorporated herein in their entirety by reference, including the drawings, charts, schematics, diagrams and related written description.

The first utility layer 402 can also comprise a rigid frame structure added to the virtual wafer. This rigid frame embodiment can be utilized with a silicone virtual wafer in addition to or in lieu of the second utility layer 502. This concept is illustrated in FIG. 6, which depicts a rigid frame supported virtual wafer 600 comprising a rigid frame 602, an array of light emitters 604, a functional layer 606 and a silicone utility layer 608. The frame 602 can be made from any non-flexible material, for example, rigid plastics, metal or FR4.

Referring to the process sequence in FIGS. 3A-3F, the frame is placed on top of the adhesive layer 302 in the step depicted in FIG. 3A such that the frame surrounds the light emitter 312 array. After the pressing step depicted in FIG. 3B, functional layer coating 320 and silicone utility coating are added and the virtual wafer is released from the carrier wafer 304. At this point, the light emitter array, converter and clear silicone form a membrane that is held by the edges by the frame and cannot distort by contraction. It is understood that while silicone is disclosed as a possible utility layer that can be utilized with the frame structure, utility layers comprising other materials can also be utilized.

FIG. 7 shows another view of the rigid frame structure. FIG. 7 shows a virtual wafer 700 comprising a clear silicone utility structure 702 which supports an array of light emitters as is depicted in FIG. 6 above and a rigid frame 704. FIG. 7 also shows an intermediate membrane 706 in between the silicone utility structure 702 and the rigid frame 704. This intermediate membrane 706 can provide additional support between the silicone utility structure 702 and the rigid frame 704 and can improve alignment tolerance. For example, when placing the frame on the virtual wafer, some space between the frame and the die array can be utilized so the alignment process need not be as precise.

As mentioned above, light emitting devices according to the present disclosure can be further connected to component substrates, such as substrates comprising PCBs. In some light emitting devices, connecting the light emitting device to the metal traces of the component substrate typically involves applying connection material, for example, electrically conductive attach material, solder, flux or conductive epoxy, to the metal traces. The bond line between the light emitter and the metal traces is therefore relatively thin (<10 um) and the stand-off distance between the converter wings and the package floor is correspondingly thin.

In other light emitting devices, different connection methods can be applied to connect the light emitter to a package substrate. Utilizing one method, connection material is first printed or dispensed on a package substrate such as a PCB, then the light emitter is placed with its contacts in contact with the solder paste, and finally the solder paste is melted as the assembly runs through a reflow oven. The final solder line thickness depends primarily on the thickness of the solder paste, and is typically in the range of 20-150 um. The vertical stand-off between the functional layer and the PCB is therefore much larger than for thinner bond line light emitters, and this creates different desired features regarding the thicker bond line light emitters than those with thinner bond lines. Light emitter attach failure due to expanding silicone and flexing functional portions, such as wings, is less of a concern in the thicker bond line light emitters, due to the inherently large stand-off of the contact light emitters. However, for example in the case of white emitting devices, blue light escaping the light emitter through the bottom of the functional layer should ideally be minimized or else gross color uniformity, uncontrolled color point, and/or low efficiency can result.

FIG. 8 illustrates another embodiment of a light emitting device 800 which proposes a solution to the above issue. Light emitting device 800 comprises a light emitter 802, a functional layer 804 which can comprise functional layer wings 806, contacts 808, a reflector 810 and a first utility layer 812. Light emitting device 800 is shown attached to a metal trace 814 of a PCB 816 with connection material 818. The structure is similar to the light emitter embodiment depicted above in FIG. 4, except that a secondary reflector 820, such as a diffuse reflector, for example, a white coating or paint, can be provided in contact with a portion of the functional layer. In the embodiment shown, the secondary reflector 820 is provided on the bottom side of the functional layer wings, overlapping with the reflector contacts 808.

The secondary reflector 820 reflects light coming from the light emitter 802 minimizing light exiting through the bottom of the functional layer 804. The extent to which the secondary reflector 820 reflects light depends on its thickness and the material properties of the secondary reflector 820. In some embodiments, the secondary reflector comprises white paint having a thickness of 20 um-100 um, and the white paint consists of a high loading of high refractive index particles inside a low refractive index polymer. The polymer can have minimum optical absorption and remain optically stable during the lifetime of the light emitting device 800. It is understood that many different secondary reflectors can be used in lieu of or in addition to diffuser reflectors such as white paint, for example, thin film reflectors, such as metal or dielectric layers. Similar to the light emitter embodiments discussed above in FIG. 4, the light emitting device 800 can also include a glass wafer on top, to improve mechanical stability and ease of handling during processing and testing.

One method for fabricating the light emitting device 800 in FIG. 8 is similar to that of fabricating the light emitting device 400 in FIG. 4 above. At the point during the manufacturing process where the virtual wafer (including light emitters, the functional layer and the utility layer) is released from the carrier wafer and the adhesive layer is removed, the secondary reflector 820, such as white paint, is applied to the backside of the virtual wafer through screen printing or another selective area deposition technique. Since the white paint application is ideally aligned to the contacts 808 of the light emitter 802, or to the reflector 810, and this alignment may not be perfect, to compensate the white painted area can overlap somewhat with the reflector 810 and contacts 808 to ensure that no light escapes between the edge of the reflector 810 and the white paint.

Additional methods of application of a secondary reflector 820 incorporating features of the present disclosure are discussed herein. FIG. 9 illustrates another embodiment of a light emitting device 900, similar to light emitting device 800 above, wherein like reference numbers are used to denote like features. Light emitting device 900 comprises light emitter 802, a functional layer 804 which can comprise functional layer wings 806, a reflector 810, and a utility layer 812. Light emitting device 800 is shown attached to a metal trace 814 of a PCB 816 with connection material 818. However, light emitting device 900 comprises thicker contacts 902, which can be, for example, in the range 20-100 um, and a thicker secondary reflector layer 904, for example a thicker layer of white paint.

Secondary reflector layer 904 can be formed by placing a blanket layer of white paint onto the adhesive layer prior to placing the light emitter array on the adhesive layer. While the white paint is still wet or soft, the light emitters are placed on the paint-adhesive layer-carrier stack and then pressed into the paint (as discussed in FIG. 3B above). The paint is thus pushed aside by the light emitter contacts allowing the contacts to contact (or nearly contact) the adhesive layer. At a later point in the process, when the virtual wafer is released from the carrier and the adhesive layer is removed, the light emitter contacts can be exposed from the bottom, possibly with small amounts of white paint residue on them. This residue can be removed, for example, by mechanical means, such as by grinding, polishing or rubbing, or by chemical-mechanical means, such as polishing or rubbing using a chemical that slowly dissolves the polymer binder of the paint, or by plasma etching.

FIG. 10 illustrates another embodiment of a light emitting device 1000, similar to light emitting device 900 above, wherein like reference numbers are used to denote like features. Light emitting device 1000 comprises light emitter 802, a functional layer 804, a reflector 810, and a utility layer 812. Light emitting device 1000 is shown attached to a metal trace 814 of a PCB 816 with solder paste 818. Similar to FIG. 9 above, the contacts 902 are relatively thick, in the range 20-100 um.

Unlike light emitting device 900 above, light emitting device 1000 does not comprise a secondary reflector to reflect light at the bottom of the functional layer. Instead, the geometry of light emitting device 1000 is such that all parts of the light emitter 802 not covered by the reflector 810 or the contacts 902 are coated by thicker functional layer 1002, including the bottom corners of the light emitter, forming functional layer wings 1004. This ensures that there is no excessive leakage of light emitted from the light emitter 802 and not affected by the functional layer 1002. This embodiment is fabricated the same way as the light emitting device 400 in FIG. 4 above, except that the light emitter 802 in FIG. 10 have thicker contacts 902.

Figure 11:
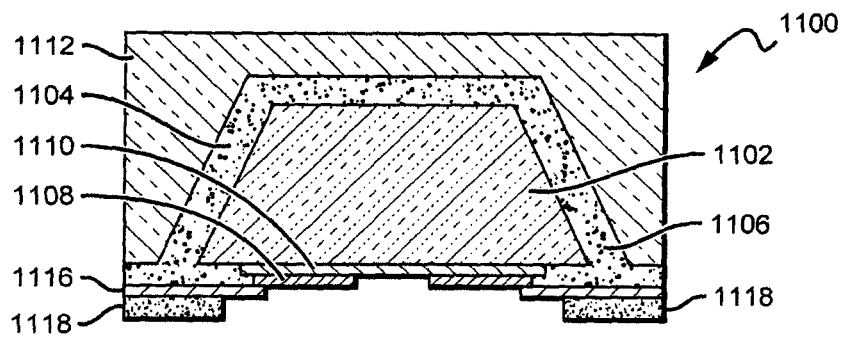
FIG. 11 is front sectional view of a light emitting device incorporating features of the present invention.

In the embodiments of light emitting devices mentioned so far, the utility layer encapsulation (e.g. clear silicone or clear silicone and glass) and/or the functional layer are attached only to the light emitter. During handling of PCBs with light emitting devices attached, it is possible that the encapsulation can inadvertently be removed. FIG. 11 shows a light emitting device embodiment that has additional features intended to reduce the risk of having the encapsulation damaged or removed. FIG. 11 shows the light emitting device 1100 at the chip level prior to attachment to a PCB. Light emitting device 1100 comprises a light emitter 1102, a functional layer 1104 comprising functional layer wings 1106, contacts 1108, a reflector 1110, a utility layer 1112 and a secondary reflector 1116, such as white paint.

The light emitting device 1100 further comprises adhesive elements 1118, which can be added to a portion of the functional layer and/or secondary reflector 1116, for example to the bottom side of the functional layer wings 1106, under the secondary reflector 1116 and can be arranged to connect the light emitting device to a package substrate, such as a substrate comprising an electronic element, such as a PCB. In some embodiments, the adhesive elements 1118 comprise a polymer that is stable at room temperature and at the light emitting device's 1100 operating temperature, but flows at the temperature used to attach the light emitting device to an electronic element such as a PCB. This is shown in FIG. 12 below.

Figure 12:
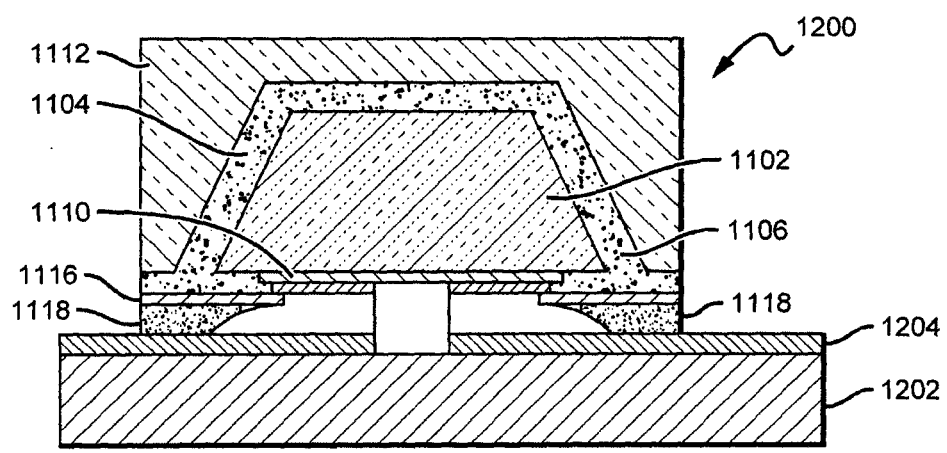
FIG. 12 is front sectional view of a light emitting device incorporating features of the present invention.

FIG. 12 shows a light emitting device 1200, similar to light emitting device 1100 in FIG. 11 above, where like reference numbers are used to denote like features. Light emitting device 1200 comprises a light emitter 1102, a functional layer 1104 comprising functional layer wings 1106, contacts 1108, a reflector 1110, a utility layer 1112, a secondary reflector 1116, such as white paint, and adhesive elements 1118. After attaching the light emitting device 1200 to the PCB 1202 via metal traces 1204, the adhesive elements 1118 can flow to connect the functional layer wings 1004 of the light emitting device 1200 to the PCB 1202. This serves to mechanically anchor the functional layer wings 1106 to the PCB 1202, thus increasing the handling robustness.

Although the present invention has been described in detail with reference to certain preferred configurations thereof, other versions are possible. Embodiments of the present invention can comprise any combination of compatible features shown in the various figures, and these embodiments should not be limited to those expressly illustrated and discussed. Therefore, the spirit and scope of the invention should not be limited to the versions described above.

The foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

We claim:

1. A light emitting device, comprising:
   a light emitter comprising a top emitting surface and at least one side emitting surface;
   one or more contacts on a surface of said light emitter;
   a functional layer on said light emitter, said functional layer configured such that light emitted from said top emitting surface and said at least one side emitting surface passes through a substantially similar functional layer thickness; and a reflector distinct from said contacts and interposed between a bottom surface of said light emitter and a top surface of said one or more contacts, wherein said bottom surface of said light emitter is covered by said reflector and at least a portion of said functional layer;

wherein said functional layer and said one or more contacts are separated by a stand-off distance of between 10 and 30 micrometers, wherein said stand-off distance is in a direction normal to said bottom surface of said light emitter; and wherein said functional layer comprises an extended lateral portion which extends parallel to said bottom surface of said light emitter, wherein a bottom surface of said extended lateral portion is substantially exposed.

2. The light emitting device of claim 1, wherein said light emitter is a light emitting diode (LED).

3. The light emitting device of claim 1, wherein said functional layer comprises a wavelength conversion layer.

4. The light emitting device of claim 3, wherein said wavelength conversion layer interacts with light emitted from said light emitter such that said light emitting device produces white light.

5. The light emitting device of claim 1, further comprising a first utility layer on said functional layer.

6. The light emitting device of claim 1, further comprising a second utility layer on said first utility layer.

7. The light emitting device of claim 6, wherein said second utility layer comprises glass.

8. The light emitting device of claim 1, further comprising a secondary reflector.

9. The light emitting device of claim 8, wherein said secondary reflector comprises a white diffuse reflective material.

10. The light emitting device of claim 9, wherein said reflective white material comprises white paint.

11. The light emitting device of claim 1, further comprising adhesive elements configured to facilitate connection of the light emitting device to a package substrate.

12. The light emitting device of claim 1, further comprising:
a package substrate,
wherein said light emitting device is connected to said package substrate.

13. The light emitting device of claim 12, wherein said package substrate comprises a printed circuit board (PCB).

14. A light emitting device, comprising:
a light emitter;
one or more contacts on a surface of said light emitter;
a functional layer on said light emitter, said functional layer comprising an extended lateral portion extending under and covering a light emitter bottom surface between the edges of said light emitter;
a first reflector interposed between said light emitter bottom surface and said one or more contacts; and
a first utility layer on said functional layer, said first utility layer comprising a rigid frame structure;
wherein substantially all of a bottom surface of said extended lateral portion covering said light emitter bottom surface is coated with a second reflector,
wherein said functional layer and said second reflector extend parallel to said light emitter bottom surface and said second reflector extends to at least partially overlap with said first reflector, wherein said bottom surface of said second reflector is substantially exposed.

15. The light emitting device of claim 14, wherein said light emitter is a light emitting diode (LED).

16. The light emitting device of claim 14, wherein said functional layer comprises a wavelength conversion layer.

17. The light emitting device of claim 16, wherein said wavelength conversion layer interacts with light emitted from said light emitter such that said light emitting device produces white light.

18. The light emitting device of claim 14, further comprising a second utility layer on said first utility layer.

19. The light emitting device of claim 18, wherein said second utility layer comprises glass.

20. The light emitting device of claim 14, further comprising adhesive elements contacting said reflective coating.

21. The light emitting device of claim 14, further comprising:
a package substrate,
wherein said light emitting device is connected to said package substrate.

22. The light emitting device of claim 21, wherein said package substrate comprises a printed circuit board (PCB).

23. The light emitting device of claim 22, wherein said functional layer extended lateral portion is connected to said package substrate by one or more adhesive elements.

24. A light emitting device, comprising:
a light emitter comprising a top emitting surface and at least one side emitting surface;
one or more contacts on a surface of said light emitter;
a functional layer on said light emitter, said functional layer configured such that light emitted from said top emitting surface and said at least one side emitting surface passes through a substantially similar functional layer thickness;
a first reflector interposed between said light emitter and said one or more contacts, wherein said first reflector laterally extends along a bottom surface of said light emitter;
a package substrate connected to said light emitting device; and
a second reflector between said light emitter and said package substrate, wherein said first reflector and said second reflector cover substantially all of a bottom surface of said light emitter, said second reflector at least partially overlapping with said first reflector;
wherein a bottom surface of said second reflector and a top surface of said package substrate are separated by a distance normal to said bottom surface of said light emitter;
wherein said functional layer comprises an extended lateral portion which extends parallel to said bottom surface of said light emitter, wherein said second reflector is at least partially on said extended lateral portion, wherein said bottom surface of said second reflector is substantially exposed.

25. The light emitting device of claim 24, wherein said light emitter is a light emitting diode (LED).

26. The light emitting device of claim 24, wherein said functional layer comprises a wavelength conversion layer.

27. The light emitting device of claim 26, wherein said wavelength conversion layer interacts with light emitted from said light emitter such that said light emitting device produces white light.

28. The light emitting device of claim 24, wherein said second reflector comprises a white diffuse reflective material.

29. The light emitting device of claim 28, wherein said reflective white material comprises white paint.

30. The light emitting device of claim 24, further comprising adhesive elements configured to facilitate connection of the light emitting device to a package substrate.

31. The light emitting device of claim 24, wherein said package substrate comprises a printed circuit board (PCB).

32. The light emitting device of claim 24, further comprising a first utility layer on said functional layer.

33. The light emitting device of claim 32, further comprising a second utility layer on said first utility layer.

* * * * *